(12) United States Patent
Köhler et al.

(10) Patent No.: US 8,289,726 B2
(45) Date of Patent: Oct. 16, 2012

(54) ELECTRICAL DEVICE WITH SCREEN

(75) Inventors: Stefan Köhler, Frankfurt (DE); Peter Wiese, Kelkheim (DE)

(73) Assignee: Continental Automotive GmbH, Hannover (DE)

( * ) Notice: Subject to any disclaimer, the term of this patent is extended or adjusted under 35 U.S.C. 154(b) by 613 days.

(21) Appl. No.: 12/301,532

(22) PCT Filed: May 22, 2007

(86) PCT No.: PCT/EP2007/054944
§ 371 (c)(1),
(2), (4) Date: Dec. 7, 2009

(87) PCT Pub. No.: WO2007/135148
PCT Pub. Date: Nov. 29, 2007

(65) Prior Publication Data
US 2010/0091476 A1 Apr. 15, 2010
US 2011/0069468 A2 Mar. 24, 2011

(30) Foreign Application Priority Data
May 23, 2006 (DE) .......................... 10 2006 024 551

(51) Int. Cl.
*H05K 7/00* (2006.01)

(52) U.S. Cl. .......................... 361/777; 361/799; 361/818

(58) Field of Classification Search .................. 361/807, 361/816, 818, 600, 679.01, 799, 777
See application file for complete search history.

(56) References Cited

U.S. PATENT DOCUMENTS

| 5,491,301 A | 2/1996 | Akiba et al. .................. 174/250 |
| 6,188,297 B1 * | 2/2001 | Akiba .............................. 333/12 |
| 6,614,663 B1 * | 9/2003 | Yokota et al. ................. 361/780 |
| 7,019,817 B2 * | 3/2006 | Hashimoto et al. ............. 355/72 |
| 7,085,142 B2 | 8/2006 | Berberich ...................... 361/818 |
| 7,345,892 B2 | 3/2008 | Imazato et al. ............... 361/818 |
| 2005/0270758 A1 | 12/2005 | Imazato et al. ............... 361/816 |

FOREIGN PATENT DOCUMENTS

| DE | 10224221 | 12/2003 |
| EP | 0429037 | 5/1991 |
| EP | 0805619 | 11/1997 |
| JP | 10223787 A | 8/1998 |
| JP | 2005333027 A | 12/2005 |
| WO | 01/33631 A1 | 5/2001 |
| WO | 2005/029937 | 3/2005 |

OTHER PUBLICATIONS

International Search Report and Written Opinion; PCT/EP2007/054944; pp. 6, May 22, 2007.

* cited by examiner

*Primary Examiner* — Hung S Bui
(74) *Attorney, Agent, or Firm* — King & Spalding L.L.P.

(57) ABSTRACT

An electronic device (10) has a screen (12) protecting against radiofrequency electromagnetic fields, wherein the screen is formed by an at least partially conductive cap (12). In order to avoid the formation of a defined conductive connection between the cap (12) and a reference potential, conductive two-dimensional regions (30) of the cap (12) are arranged in electrically insulated fashion at a short distance parallel to at least one two-dimensional region (42) of a conductor (22) of a reference potential. The two-dimensional regions act as a capacitor and a capacitive coupling (12) to the reference potential is produced which eliminates or attenuates radiofrequency electromagnetic interference fields, which enter the electronic device or are emitted from it.

20 Claims, 3 Drawing Sheets

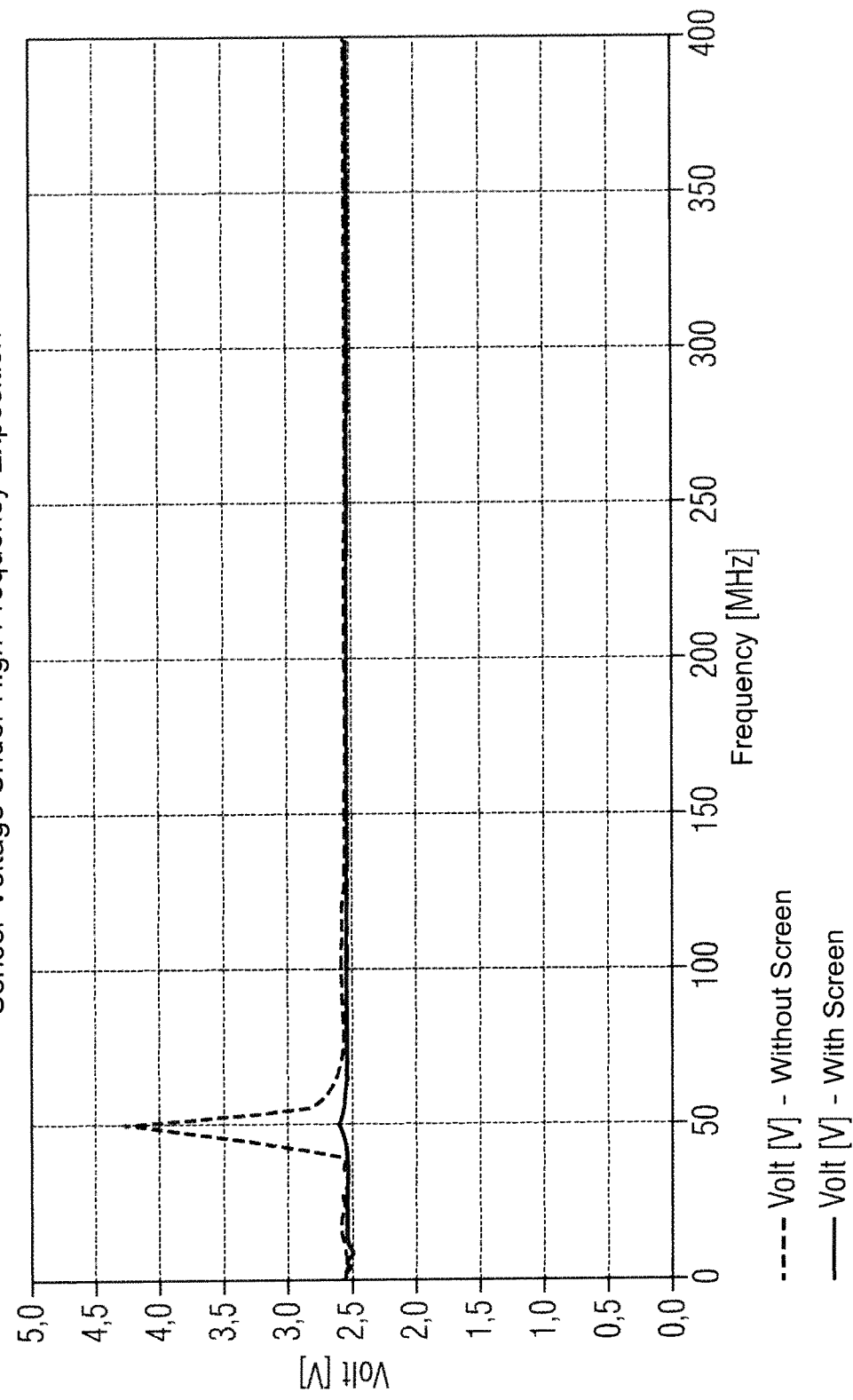

ELECTRICAL DEVICE WITH SCREEN

CROSS-REFERENCE TO RELATED APPLICATIONS

This application is a U.S. National Stage Application of International Application No. PCT/EP2007/054944 filed May 22, 2007, which designates the United States of America, and claims priority to German Application No. 10 2006 024 551.2 filed May 23, 2006, the contents of which are hereby incorporated by reference in their entirety.

TECHNICAL FIELD

The present invention deals with an electronic device with a screen against radio-frequency electromagnetic fields, wherein the screen consists of an at least partially conductive cap surrounding the device.

BACKGROUND

In electronic devices which comprise complete circuits or only individual components, for example electronic sensors, the problem exists, depending on application, that radio-frequency electromagnetic interference fields can lead to an influence on the signal which disturb the operation of the electronic device. Conversely, the electronic device itself can also be the cause of radio-frequency electromagnetic fields which are to be screened with the aid of the cap in order to avoid, for example, interfering with surrounding electronic components or the radio reception in the environment.

It is known to use at least partially conductive housings in accordance with the principle of the Faraday cage to screen off static electrical fields without further measures. In the case of radio-frequency electromagnetic fields, it is not sufficient to surround the screened components with conductors, but rather, these must be electrically connected to a reference potential in order to achieve effective screening. Otherwise, it may occur, in the worst case, that the screening itself, operating as an antenna, couples radio-frequency energy in or out and thus worsens the interference problem even more.

In the simplest case, so-called galvanic grounding of the screen to a reference potential is sufficient in this case, wherein, in the case of alternating voltages, an arbitrary potential can be selected, as a rule, in order to achieve the desired screening.

For applications in which direct galvanic grounding of the housing is inadmissible, for example for the screen housings of control devices in the automobile field, the coupling is also done capacitively by a conventional combination of a resistor with a capacitor arranged in parallel, which are constructed as discrete components with particular characteristic values for the resistance and the capacitance.

In all known solutions, this results in the problem that in the case of a housing or a cap as screen, a direct electrical connection must always be established to the reference potential which means additional expenditure. The electrical connection must also be constructed to be durable so that, for example in the automobile field, there can be no interruption of the electrical connection and thus a failure of the screen affect even after many years of use.

Particular problems in using conductive caps also exist if, for example, only one particular component is to be screened which is arranged on a circuit board or conductors of a so-called lead frame in which stamped metallic or sheet-metal elements are held by a plastic carrier. Since, as a rule, several conductors of different potentials are here arranged in the circuit board or lead frame plane, a careless arrangement of a conductive cap can rapidly lead to a risk of short circuits.

SUMMARY

According to various embodiments, an electronic component can be provided with a screen which, without great expenditure, prevents permanent irradiation or radiation of radio-frequency electromagnetic fields.

According to an embodiment, an electronic device may comprise a screen against radio-frequency electromagnetic fields, wherein the screen consists of an at least partially conductive cap surrounding the device, wherein conductive two-dimensional regions of the cap are arranged electrically insulated at a short distance in parallel with at least one two-dimensional region of a conductor of a reference potential so that a capacitive coupling of the cap to the reference potential is produced, and wherein the two-dimensional regions of the cap interact with two-dimensional regions of various conductors having different reference potentials.

According to a further embodiment, the electrical insulation between the two-dimensional regions can be formed by an inserted foil. According to a further embodiment, the electrical insulation can be formed by a non-conductive coating of the two-dimensional regions of at least one of the cap and the two-dimensional regions of associated conductors. According to a further embodiment, the two-dimensional regions of the cap can be formed on a front edge area on the end of the cap, which is perpendicular to the two-dimensional conductors of the at least one reference potential. According to a further embodiment, the cap may consist of metal. According to a further embodiment, the cap may consist of a plastic to which metal or carbon fibers are added. According to a further embodiment, the cap can be provided with a metallic coating in the area of the two-dimensional regions and on at least one of the inside and the outside. According to a further embodiment, the cap can be coated with a conductive lacquer at least in the two-dimensional regions and on at least one of the inside and the outside. According to a further embodiment, a direct connection can be provided between the conductive cap and the conductor of a reference potential. According to a further embodiment, the direct connection can be formed by a conductive projection arranged at the cap or the conductor of the reference potential, which protrudes through the electrical insulation. According to a further embodiment, the conductors can be arranged on a circuit board or, as metallic rail or sheet-metal elements, together with a plastic carrier, form a leadframe. According to a further embodiment, the plastic carrier may form the electrical insulation between the two-dimensional regions of the cap and the conductor in the support area of the two-dimensional regions of the cap by hot fold-over. According to a further embodiment, the electrical insulation may have a relative dielectric constant having a value of greater than 1 between the two-dimensional regions.

BRIEF DESCRIPTION OF THE DRAWINGS

In the text which follows, an exemplary embodiment of the invention will be discussed in greater detail by means of the attached drawings, in which:

FIG. 4 shows an illustration of the sensor voltage of the sensor according to FIG. 4 over the frequency of radio-frequency interference irradiations.

DETAILED DESCRIPTION

Figure 1:
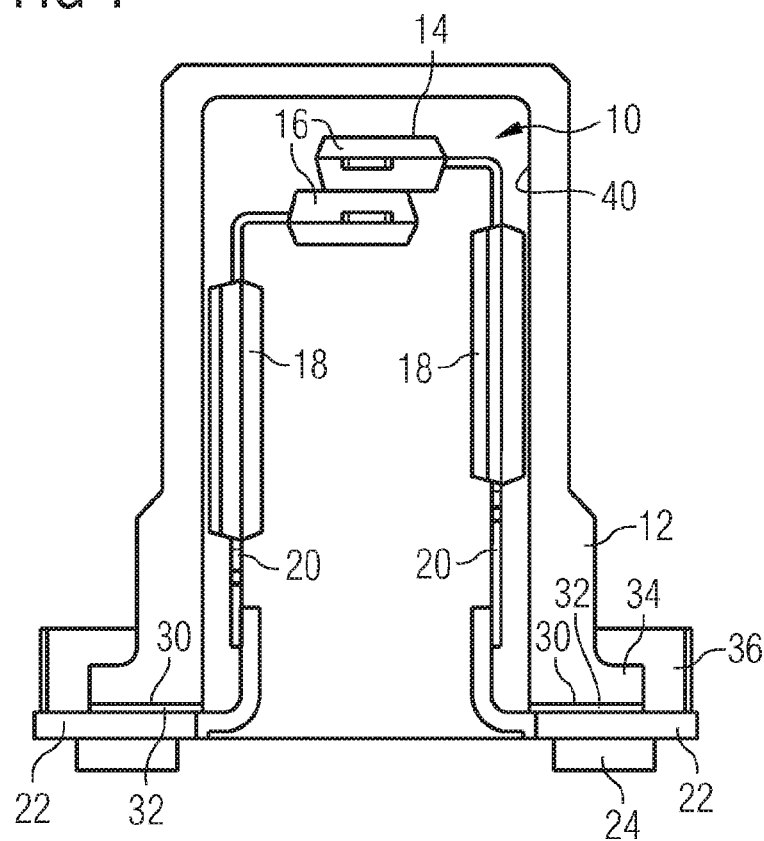
FIG. 1 shows a longitudinal section through an electronic device with a screen.

According to various embodiments, in an electronic device of the type initially mentioned conductive two-dimensional regions of the cap are arranged electrically insulated at a short distance in parallel with at least one two-dimensional region of a conductor of a reference potential so that a capacitive coupling of the cap to the reference potential is produced.

The various embodiments offer the advantage that the cap with the at least one conductor, which is provided in any case, virtually forms a capacitor, i.e. due to the narrow, electrically insulated arrangement of the two-dimensional regions of the cap with respect to a two-dimensional region of the at least one conductor of a reference potential, the same effect as would be produced by a capacitor of corresponding capacitance, which would be electrically connected to the conductor, on the one hand, and the cap, on the other hand, would be produced. Since, however, no connecting wires are required between the cap and the conductor in the solution according to various embodiments, the capacitive coupling created is extremely low in inductance so that the screening effect extends up into the gigahertz range.

The various embodiments are similarly suitable for screening complex assemblies which in this case are also to be understood by the term device, as individual components such as, e.g., sensors which are arranged on a circuit board or the lead frame already mentioned. Since capacitive linking in any case requires an insulation layer between the conductive two-dimensional regions of the cap and the two-dimensional regions of the conductor, there is also no problem with respect to the mounted cap being able to short circuit the feed line of the electrical device.

In one embodiment, the two-dimensional regions of the cap interact with two-dimensional regions of various conductors having different reference potentials. In this manner, it is possible to utilize the two-dimensional regions of several conductors or, respectively, on a circuit board in the case of a lead frame construction, since the individual capacitances which are generated by the respective two-dimensional regions add up so that a capacitive coupling with higher capacitance is achieved overall.

In principle, all electrically insulating materials are suitable for the electrical insulation between the two-dimensional regions which form the capacitive coupling. In the simplest case, an air gap would already generate the desired capacitance, whereas an air gap is less suitable because of the risk of voltage arc-overs with the small distances desired for achieving the greatest possible capacitance, and there would be a risk of closing the air gap with conductive dirt which, in turn, could short circuit a number of conductors via the conductive cap. Insulating foils of, for example, polyimide have been found to be successful, and nonconductive coatings between the two-dimensional regions have also been found to be suitable, wherein the nonconductive coatings can be provided on the cap and/or the two-dimensional regions of the conductors.

A further embodiment provides that the two-dimensional regions of the cap are formed on a front edge area of the cap on the end which, is perpendicular to the two-dimensional conductor of the at least one reference potential. Such a construction allows the use of elongated caps, for example in the form of a cylinder which is closed with respect to the two-dimensional region so that the electronic component can be arranged deeply in the cap and the risk of irradiation through the open region of the cap within the front edge region is minimized.

In order to construct the cap to be conductive, it can be provided in the simplest case that it consists of metal, but embodiments of plastic are also possible to which metal or carbon fibers are added to achieve the conductivity. In the same manner, conductive coatings on the inside and/or outside of the cap are possible for achieving the conductivity, wherein, for example, the application of a metallic coating by vapor deposition or sputtering or the application of a conductive lacquer or a graphite layer could be mentioned.

In a further embodiment, it is provided that a direct connection is provided between the conductive cap and the conductor of a particular reference potential. Such a direct connection which, in principle, also favors the screening of radio-frequency electromagnetic fields, offers the advantage, particularly in the case of caps with conductive surfaces, that, in the case of a higher voltage, which may be unintentionally introduced into the cap, for example due to a voltage arc-over, a controlled low-resistance connection is provided via which the voltage potential can be removed whereas, if a low-resistance connection is lacking, there could be a breakdown of the insulation layer at an unwanted location. Since the direct connection is not necessary for the radio-frequency screen according to various embodiments, the demands on its contacts which are usually high, do not need to be made so that, for example, a simple touch contact is sufficient. This can be implemented, for example, in that the direct connection is formed by a conductive projection arranged at the cap or the conductor of the reference potential, which protrudes through the electrical insulation. Naturally, such a direct connection must only be established to one single reference potential.

As already mentioned, the conductors can be arranged on a circuit board or as, solid rail or sheet-metal elements, together with a plastic carrier, form a lead frame, wherein the arrangement of the conductors, as a rule, is then provided in the form of a star with respect to the component which is screened by the cap so that the front edge area of the cap can be placed on the two-dimensional surfaces of the conductors. In the case of a leadframe, the electrical insulation between the two-dimensional regions can also be established by the plastic protruding in the direction of the cap forming the insulating layer by hot fold-over.

The screen according to various embodiments can be used as electronic component which detects the position of a shaft, for example, in a permanent-magnet sensor.

If only relatively small two-dimensional regions are available for building up the coupling capacitance, it can be increased by reducing the distance of the two-dimensional regions from one another or also by using insulators with a relative dielectric constant of greater than one.

Figure 3:
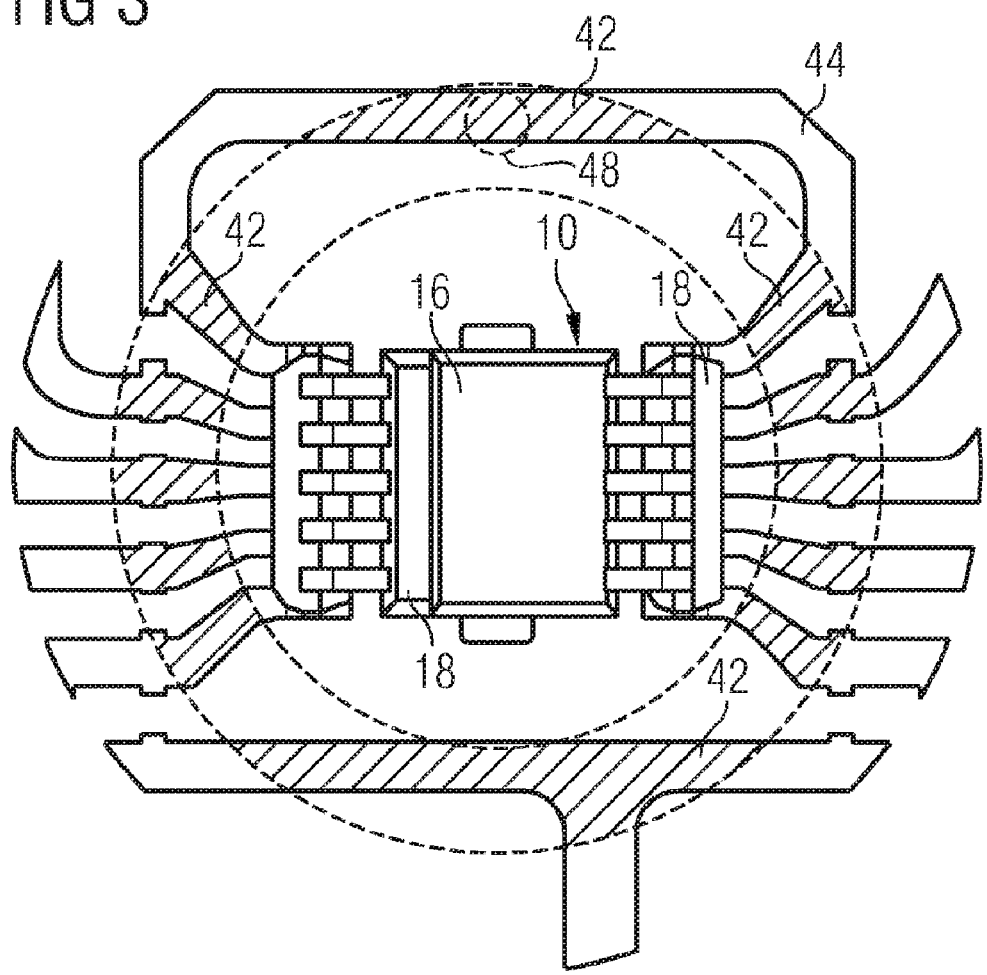
FIG. 3 shows a top view of the connecting conductors of the electronic device from FIG. 1 with the screen removed.

FIG. 1 shows an electronic device 10 which is surrounded by a screen 12 in the form of a cap. The electronic device 10 consists of two redundantly arranged angle transmitters 14 which in each case consist of a permanent-magnet sensor 16 and respective associated control electronics 18. The two control electronics 18 are connected via contact tabs 20 to conductors 22 which, together with an insulating plastic carrier 24, form a so-called leadframe (see also FIG. 3).

The cap 12 is formed in the shape of a cup and placed over the electronic device 10, being supported on its open side at the front on the conductors 22 via an annular support area 30 via an intermediate electrical insulation 32. The end-face annular area has an outside flange 34, protruding annularly outward, around which an annular plastic compound 36 is molded by which means it is held on the leadframe.

Figure 2:
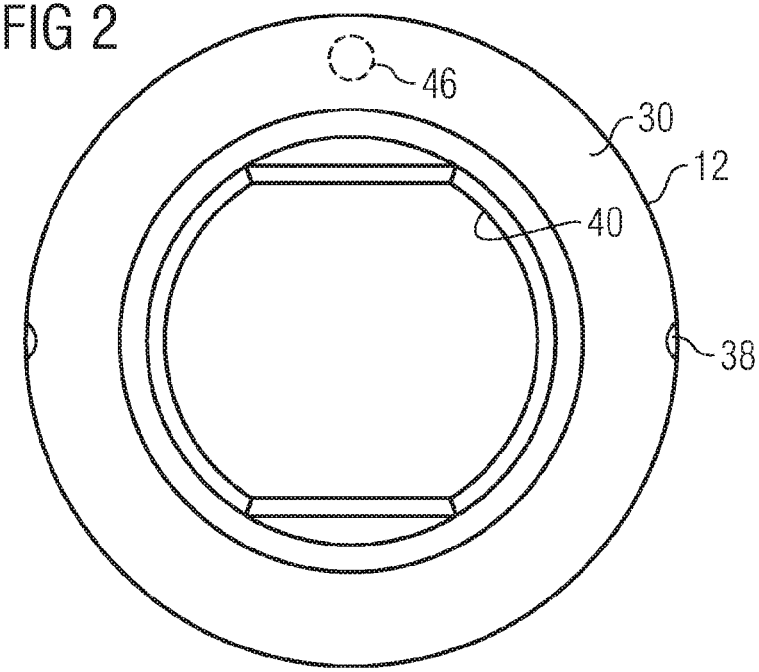
FIG. 2 shows a front view of the removed screen from FIG. 1.

The cap 12 consists of a conductive material which in this case is formed of plastic with electrically conductive additives such as, e.g., carbon or metal fibers. However, embodiments are also possible in which the cap 12 consists of a non-conductive plastic and is provided with an electrically conductive coating in the region of the annular support area 30 and on the inside and/or outside. As can be seen from FIG. 2, notches 38 are provided in the outer edge of the annular support area 30, which notches enable the cap to be mounted only in a particular angular position with respect to the electronic device 10. FIG. 2 also shows that the cap has an inside cross section 40 which deviates from the circular shape in order to enclose the components to be screened as closely as possible.

The electrical insulation 32 already mentioned can consist, for example, of a thin insulating foil such as, e.g. polyimide or Kapton (registered trade mark) which, before the plastic material 36 is sprayed around the cap 12, is placed between the annular support area 30 and the conductor tracks 22. However, other non-conducting coatings are also possible for insulation wherein the insulating layer can also be formed by the plastic carrier 24 of the lead frame in that plastic parts protruding towards the top over the conductive tracks 22 are distributed two-dimensionally over the surfaces of the conductors during the hot fold-over.

Due to the parallel arrangement of the surfaces of the conductive front-end annular support area 30 of the cap 12 with respect to the two-dimensional regions 42 of the conductors 22, a capacitive coupling of the cap 12 to the conductors 22 is produced, the individual capacitances produced by the individual surfaces 42 adding to form a higher total capacitance which effectively shields radio-frequency electromagnetic fields so that these cannot radiate into the electronic device 10 and can thus corrupt the measurement result of the sensors 16. The example of FIG. 5 shows that in the case of a trial set-up similar to FIG. 1 without screen, a considerable deviation of the sensor voltage was generated in the region of an interference frequency of 50 MHz, which could eliminated almost completely after the formation of the capacitive link-up in the manner described previously.

The capacitance can be increased, for example, by increasing the size of the annular support area 30 if, as a result, further two-dimensional regions of the conductors 22 can be covered with close spacing. An additional increase in the capacitance for the capacitive coupling can be achieved by moving conductive regions of the control electronics 18 or their feed line closely to conductive regions of the inside wall 40 of the cap 12.

Apart from the capacitive coupling which is achieved without any further electrical contacting between the cap 12 and the conductors 22, an additional direct link-up of the conductive coupling 12 with a single reference potential, in this case the conductor 44, can also be provided in that, for example, a point-shaped conductive projection 46 which is approximately the same height as the insulating layer between the conductive annular support area of the cap 12 and the conductors 22 is provided at a position of the annular area 30. The projection 46 penetrates the insulation 32 and, therefore, achieves a direct connection with the conductor 44 (see FIG. 2 at 48). As a result, it is possible to divert any higher voltage potential which may have been introduced into the cap 12 without the occurrence of an uncontrolled arc-over to other conductors 22, not defined in greater detail. Naturally, attention must be paid to the fact that such a direct connection is established only to a single conductor 22 in order to avoid the formation of a short circuit.

The capacitances achieved in the capacitive coupling of the cap 12 via its annular support area to certain surface regions 42 of the conductors 22 were in the range of 10 pF, which is already adequate for the screening, even in the case of the simplest, moderately conductive coatings of the cap 12 and a simple insulating foil between the conductive regions, but could be increased slightly by more conductive metallic coatings and a minimization of the layer thickness of the electrical insulation 32. It is also possible to use insulators having a relative dielectric constant of greater than 1 in order to further increase the capacitance, for example if there is only very little space available for the annular support area or the conductors 22 are constructed only with a relatively small area at the top of the leadframe or of a circuit board.

Apart from the application shown for screening a permanent-magnetic position sensor, the screen described can also be used effectively with other electronic devices which either respond sensitively to radio-frequency interference irradiations or themselves generate radio-frequency electromagnetic fields which could interfere with surrounding electronic components or also radio and television reception. For example, the cap 12 can also be constructed as a housing which accommodates a complete electronic assembly including a number of circuit boards or the like, but it is particularly advantageous that, as a small cap, it can also screen individual devices and even individual components on a circuit board or a lead frame. Thus, for example, it can also assist in avoiding elaborately screened housings with additional RC elements where it is ultimately sufficient to screen an individual interference-sensitive component.

The invention claimed is:

1. An electronic device comprising a screen against radio-frequency electromagnetic fields, wherein the screen comprises an at least partially conductive cap surrounding the device, wherein conductive two-dimensional regions of the cap are arranged electrically insulated at a short distance in parallel with at least one two-dimensional region of a conductor of a reference potential so that a capacitive coupling of the cap to the reference potential is produced, and wherein the two-dimensional regions of the cap interact with two-dimensional regions of various conductors having different reference potentials.

2. The electronic device according to claim 1, wherein the electrical insulation between the two-dimensional regions is formed by an inserted foil.

3. The electronic device according to claim 1, wherein the electrical insulation is formed by a non-conductive coating of the two-dimensional regions of at least one of the cap and the two-dimensional regions of associated conductors.

4. The electronic device according to claim 1, wherein the two-dimensional regions of the cap are formed on a front edge area on the end of the cap, which is perpendicular to the two-dimensional conductors of the at least one reference potential.

5. The electronic device according to claim 1, wherein the cap consists of metal.

6. The electronic device according to claim 1, wherein the cap consists of a plastic to which metal or carbon fibers are added.

7. The electronic device according to claim 1, wherein the cap is provided with a metallic coating in the area of the two-dimensional regions and on at least one of the inside and the outside.

8. The electronic device according to claim 1, wherein the cap is coated with a conductive lacquer at least in the two-dimensional regions and on at least one of the inside and the outside.

9. The electronic device according to claim 1, wherein a direct connection is provided between the conductive cap and the conductor of a reference potential.

10. The electronic device according to claim 9, wherein the direct connection is formed by a conductive projection arranged at the cap or the conductor of the reference potential, which protrudes through the electrical insulation.

11. The electronic device according to claim 1, wherein the conductors are arranged on a circuit board or, as metallic rail or sheet-metal elements, together with a plastic carrier, form a leadframe.

12. The electronic device according to claim 1, wherein the plastic carrier forms the electrical insulation between the two-dimensional regions of the cap and the conductor in the support area of the two-dimensional regions of the cap by hot fold-over.

13. The electronic device according to claim 1, wherein the electrical insulation has a relative dielectric constant having a value of greater than 1 between the two-dimensional regions.

14. A method of screening an electronic device against radio-frequency electromagnetic fields, the method comprising the steps of:
arranging conductive two-dimensional regions of a cap electrically insulated at a short distance in parallel with at least one two-dimensional region of a conductor of a reference potential so that a capacitive coupling of the cap to the reference potential is produced, and the two-dimensional regions of the cap interact with two-dimensional regions of various conductors having different reference potentials; and
surrounding the device with a screen consisting of at least of the cap.

15. The method according to claim 14, comprising the step of forming the electrical insulation between the two-dimensional regions by an inserted foil.

16. The method according to claim 14, comprising the step of forming the electrical insulation by a non-conductive coating of the two-dimensional regions of at least one of the cap and the two-dimensional regions of associated conductors.

17. The method according to claim 14, comprising the step of forming the two-dimensional regions of the cap on a front edge area on the end of the cap, which is perpendicular to the two-dimensional conductors of the at least one reference potential.

18. The method according to claim 14, comprising the step of coating the cap with a conductive lacquer at least in the two-dimensional regions and on at least one of the inside and the outside.

19. The method according to claim 14, comprising the step of providing a direct connection between the conductive cap and the conductor of a reference potential.

20. The electronic device according to claim 19, wherein the direct connection is formed by a conductive projection arranged at the cap or the conductor of the reference potential, which protrudes through the electrical insulation.

* * * * *